(12) United States Patent
Chirania

(10) Patent No.: US 7,423,452 B1
(45) Date of Patent: Sep. 9, 2008

(54) INTEGRATED CIRCUIT INCLUDING A MULTIPLEXER CIRCUIT

(75) Inventor: Manoj Chirania, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 11/881,504

(22) Filed: Jul. 27, 2007

(51) Int. Cl.
*H03K 19/173* (2006.01)

(52) U.S. Cl. .......................................... 326/38; 326/41
(58) Field of Classification Search ............... 326/37–41
See application file for complete search history.

(56) References Cited

U.S. PATENT DOCUMENTS

| | | | |
|---|---|---|---|
| 5,646,545 A * | 7/1997 | Trimberger et al. ........... | 326/38 |
| 5,926,036 A | 7/1999 | Cliff et al. | |
| 6,400,180 B2 | 6/2002 | Wittig et al. | |
| 6,621,298 B2 | 9/2003 | Agrawal et al. | |
| 6,667,635 B1 | 12/2003 | Pi et al. | |
| 6,768,335 B1 | 7/2004 | Young et al. | |
| 6,768,338 B1 | 7/2004 | Young et al. | |
| 6,949,951 B1 | 9/2005 | Young et al. | |
| 6,998,872 B1 | 2/2006 | Chirania et al. | |
| 7,053,654 B1 | 5/2006 | Young et al. | |
| 7,061,271 B1 | 6/2006 | Young et al. | |

OTHER PUBLICATIONS

Xilinx, Inc.; "The Programmable Logic Data Book 1994"; published 1994; available from Xilinx, Inc., 2100 Logic Drive, San Jose, California 95124; pp. 2-110 thru 2-111.

Altera Corp; "Stratix II Device Family Data Sheet"; v1.0; published Feb. 2004; available from Altera Corporation, 101 Innovation Drive, San Jose, California 95134; pp. 2-1 thru 2-22.

Ralf Krueger and Brent Przybus; WP209 (v1.0); "Virtex Variable-Input LUT Architecture"; Jan. 12, 2004; available from Xilinx, Inc., 2100 Logic Drive, San Jose, California 95124; pp. 1-6.

Anthony Cataldo and Ron Wilson; FPGA vendors revise logic for sub-100-nm era; EE Times; Feb. 2, 2004; downloaded from http://www.eetimes.com/story/OEG20040202S0019; 4 pages.

U.S. Appl. No. 11/725,742, filed Mar. 20, 2007, Kao et al., Xilinx, Inc. 2100 Logic Drive, San Jose, CA 95124.

U.S. Appl. No. 12/059,021, filed Mar. 31, 2008, Chirania, Manoj, Xilinx, Inc. 2100 Logic Drive, San Jose, CA 95124.

* cited by examiner

*Primary Examiner*—Don P Le
(74) *Attorney, Agent, or Firm*—Justin Liu; Lois D. Cartier

(57) ABSTRACT

An integrated circuit including a multiplexer circuit and numerous memory cells are coupled to one another for improved performance. The multiplexer circuit includes a first input terminal and a second input terminal respectively coupled to an output of a first memory and an output of a second memory cell of the numerous memory cells. The multiplexer may also include select terminals coupled to a control signal and a complement of the control signal. An output of the multiplexer circuit is selectively coupled to one of four possible signals, where two of the four signals are the control signal and the complement of the control signal.

18 Claims, 7 Drawing Sheets

ABSTRACT
INTEGRATED CIRCUIT INCLUDING A MULTIPLEXER CIRCUIT

FIELD OF THE INVENTION

The invention relates to integrated circuits (ICs). More particularly, the invention relates to a select circuit for and IC.

BACKGROUND OF THE INVENTION

Select circuits or multiplexer (MUX) circuits are a well known type of circuit design. They are widely utilized in various circuit designs of ICs and systems. Multiplexer circuits also have wide applications in programmable logic devices (PLDs); one circuit that utilizes MUX circuits in a PLD is a lookup table (LUT). A PLD is a well-known type of IC that can be programmed to perform specified logic functions. One type of PLD is a field programmable gate array (FPGA), typically includes an array of programmable tiles. These programmable tiles can include, for example, input/output blocks (IOBs), configurable logic blocks (CLBs), dedicated block random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic is typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

One programmable element commonly found in FPGA logic blocks is the LUT. In one example, a six input LUT may be viewed as a 64:1 MUX circuit or as a single 64-bit RAM that is addressable by a number of input signals (e.g., six input signals). For instance, a 64:1 LUT circuit may have 64 bit memory array coupled to its input and six inputs selecting/addressing a bit from the memory array. Programming predetermined values into the memory array and using the input signals, the LUT can implement any function based on the input values. Performance parameters, such as speed and/or power, and versatility, such as larger logic functions, are in the forefront of LUT implementations.

Therefore, it is desirable to provide a multiplexer circuit that is versatile and have high performance, such as reduced propagation delay.

SUMMARY OF THE INVENTION

According to an embodiment of the invention, an integrated circuit including numerous memory cells, a multiplexer circuit having first input terminal and a second input terminal respectively coupled to an output of a first memory cell and an output of a second memory cell of the numerous memory cells. The multiplexer circuit may also include select terminals coupled to a control signal and a complement of the control signal. An output of the multiplexer circuit is selectively coupled to one of four signals based on the output of the first memory cell and the output of the second memory cell, and where two of the signals are the control signal and the complement of the control signal.

In another embodiment of the present invention, a lookup table (LUT) circuit including numerous memory cells and a first multiplexer stage having numerous 2:1 multiplexer circuits. The first multiplexer stage of the LUT circuit may have inputs coupled to outputs of the numerous memory cells, a first control signal and a complement of the first control signal. Outputs of the first multiplexer stage are selectively coupled to the first control signal and the complement of the first control signal based on the outputs of the numerous memory cells.

BRIEF DESCRIPTION OF THE DRAWINGS

The present invention is illustrated by way of example, and not by way of limitation, in the following figures.

DETAILED DESCRIPTION OF THE DRAWINGS

While the specification concludes with claims defining some features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention. In other instances, well-known circuits and devices may be omitted or presented in an abstract form in order to avoid obscuring the present invention.

Figure 1:
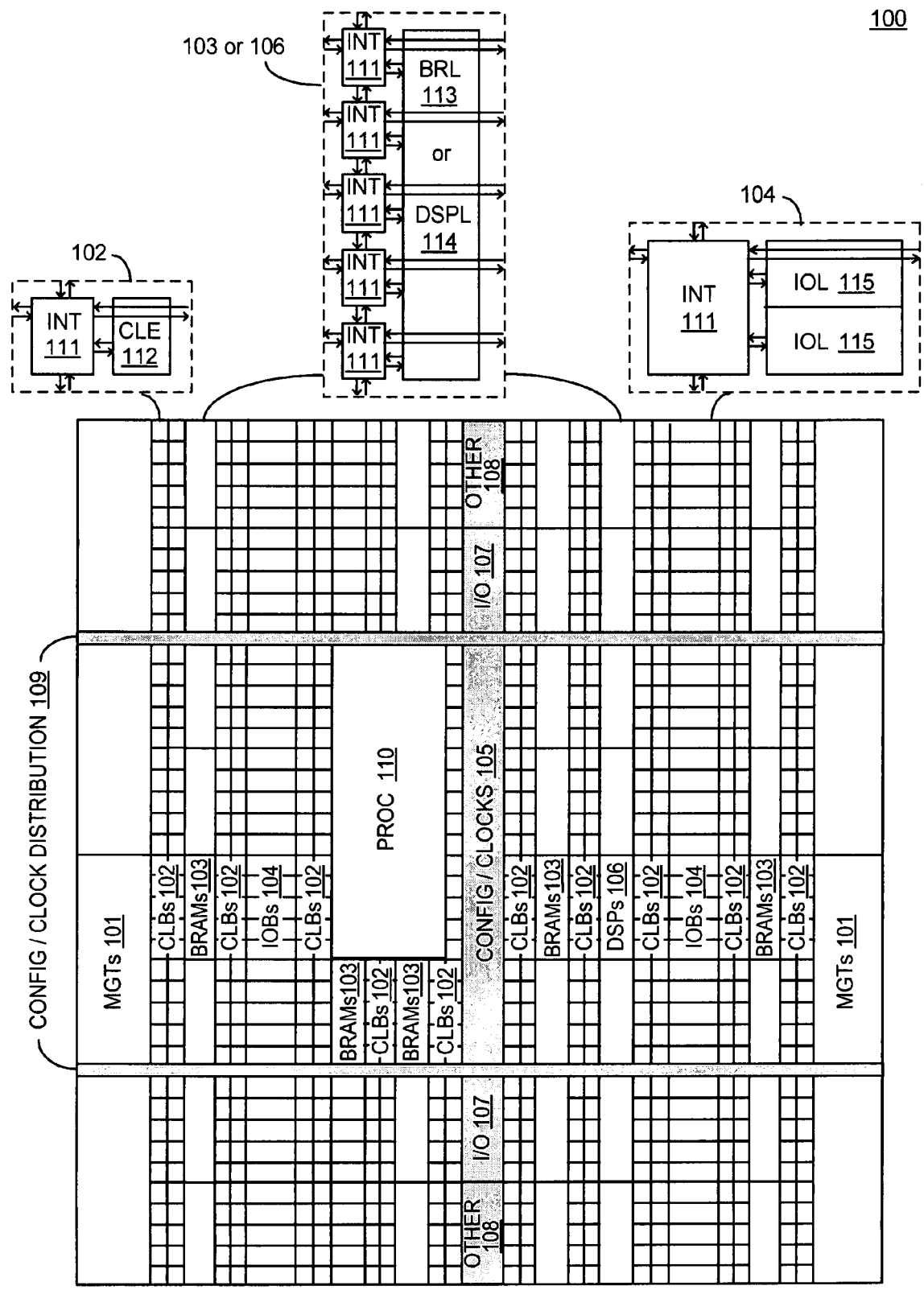
FIG. 1 is a simplified block diagram of a Field Programmable Gate Array (FPGA) that includes several different types of programmable logic blocks.

Advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
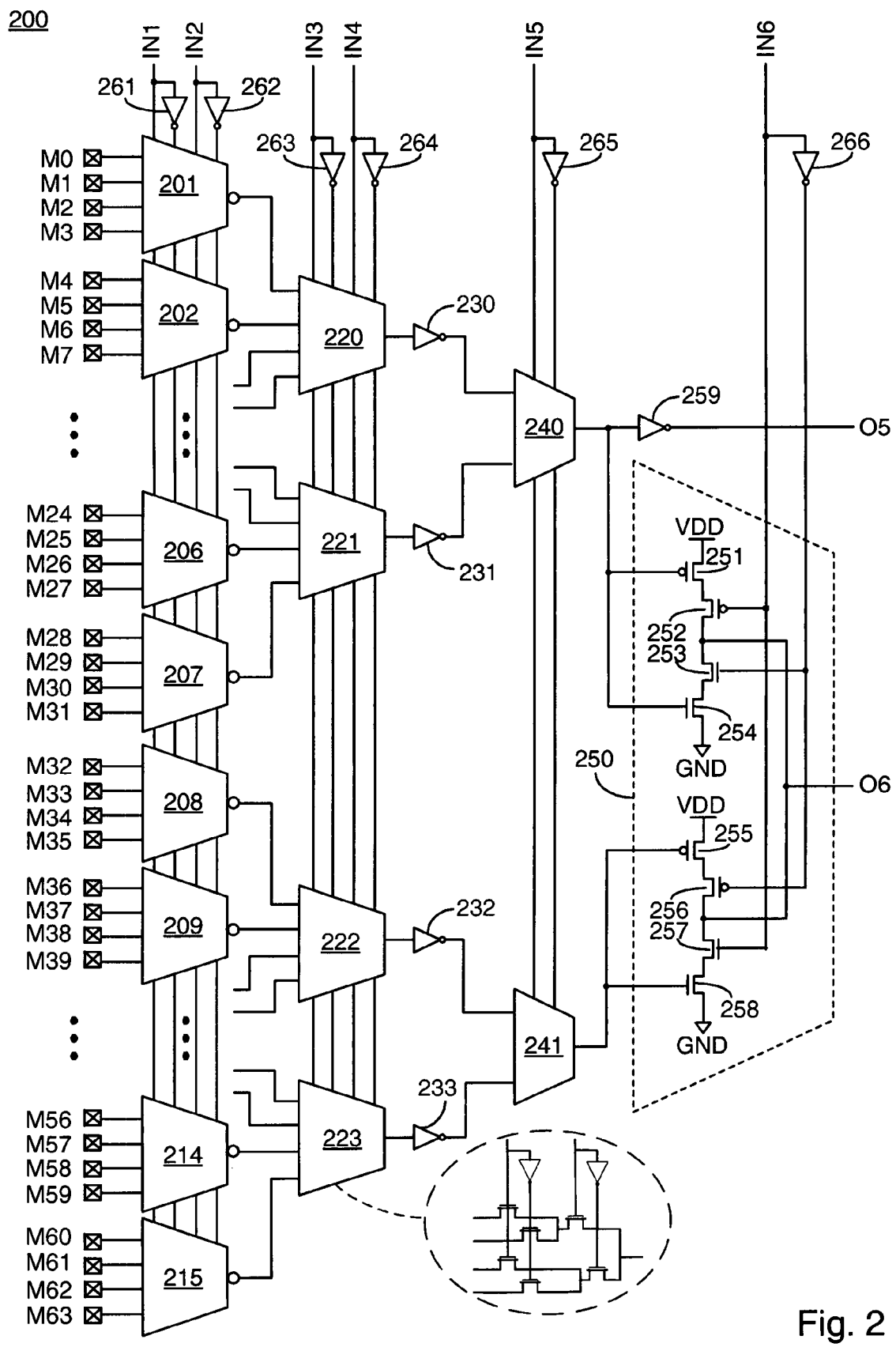
FIG. 2 illustrates a lookup table (LUT) circuit that may be used to implement a logic function.

FIG. 2 illustrates a lookup table (LUT) circuit that may be used to implement a logic function. In general, a lookup table may be viewed as a select circuit or a multiplexer (MUX) circuit coupled to memory cells. FIG. 2 shows a multi-stage 64:1 MUX circuit, where an output O6 of MUX circuit 200 is selectively coupled to output of one of the M0-M63 memory cells, which may be configuration memory cells, based on control signals IN1-IN6. For instance, an FPGA including a LUT circuit can be designed using configuration memory cells M0-M63, and multiplexer circuits (e.g. 201-215, 220-223, 240, 241, and 250) coupled to function as a 64:1 select circuit. In the embodiment of FIG. 2, configuration memory cells M0-M63 drive sixteen 4:1 multiplexers 201-215 (not all 4:1 MUX circuits are shown in FIG. 2), which are controlled by signals IN1, IN2 and their inverted counterparts (provided by inverters 261, 262) to select 16 of 64 signals provided by configuration memory cells M0-M63. In general, configuration memory cells are memory cells of an FPGA (circuit 100) programmed to configure an FPGA to perform a logic function. In an example, the configuration memory cells may be a part of a LUT circuit of the FPGA.

The selected 16 signals of MUX circuits 201-215 drive four 4:1 multiplexers 220-223. MUX circuits 220-223 are controlled by signals IN3, IN4 and their inverted counterparts (provided by inverters 263, 264). MUX circuits 220-223 selectively couple four of sixteen signals to drive inverters 230-233 based on signals IN3-IN4. Inverters 230-233 drive two 2:1 MUX circuits 240-241, which are controlled by signal IN5 and its inverted counterpart (provided by inverter 265). A complement of the output of multiplexer 240 is coupled to signal O5, where inverter 259 may provide the inversion. Therefore, output signal O5 can provide a logic function representing a maximum of five input signals, IN1-IN5. Inverters can be inserted wherever desired in the multiplexer structure, with an additional inversion being nullified by simply storing inverted data in the configuration memory cells (e.g., configuration memory cells M0-M63). For example, the circuit of FIG. 2 shows bubbles on the output terminals of multiplexers 201-215, which signifies an inversion (e.g., an inverter) on the output of each of these multiplexers. In an example, a design may require inversion of a configuration memory cell to implement a logic-function.

MUX circuits 240-241 drive data input terminals of 2:1 MUX circuit 250, which is controlled by signal IN6 and its inverted counterpart (provided by inverter 266). MUX circuit 250 selectively couples an output of MUX circuit 240 or MUX circuit 241 to the output terminal O6 based on signal IN6. In the pictured embodiment, multiplexer 250 is implemented as two tri-state buffers, where if one buffer is driving and the other buffer is disabled based on signal IN6 and its inverted counterpart (provided by inverter 266). The first buffer includes transistors 251-254, and the second buffer includes transistors 255-258, coupled together as shown in FIG. 2.

Figure 3A:
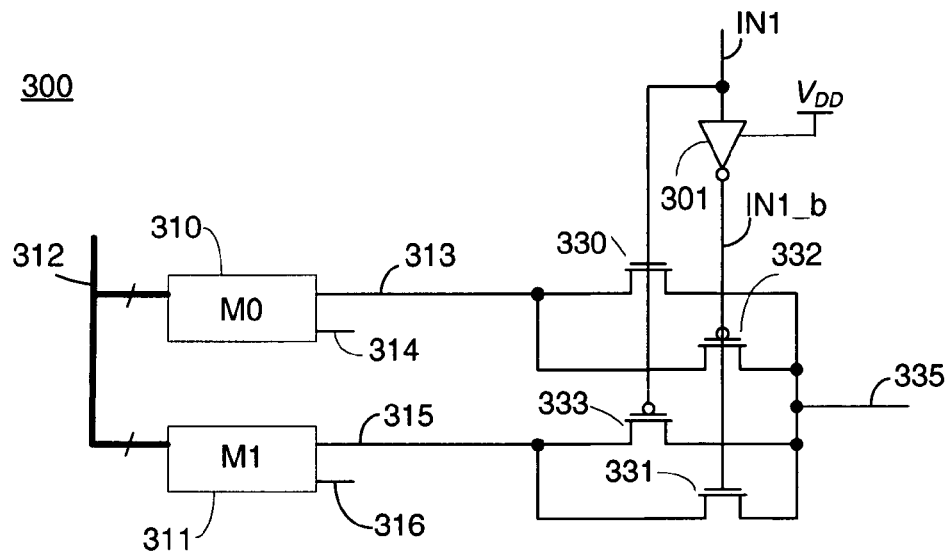
FIG. 3A illustrates a segment of a first stage select circuit of a LUT circuit.

FIG. 3A is a segment of a first stage or a first select stage circuit of a LUT circuit of FIG. 2. Circuit 300 may function as a 2:1 MUX circuit, where signal 335 (output of circuit 300) may be selectively coupled to one of outputs of memory cells M0-M1 based on signals IN1 and a complement of IN1. FIG. 3A exemplifies an embodiment of a segment of a first stage of the LUT circuit 200. The first stage of the LUT circuit 200 may include numerous select circuits 300 coupled to receive configuration memory cells M0-M63, signal IN1, and the complement of signal IN1.

Signal IN1 of circuit 300 and its inverted counterpart IN1_b (provided by inverter 301) selectively couples an output from the configuration memory cell M0 or M1 to signal 335. Configuration memory cells M0-M1 are coupled to configuration memory bus 312. The configuration memory bus 312 may be used to provide a value coupled to memory cells M0-M1 during the configuration process. For instance, configuration memory cells M0-M1 provide signals 313 and 315 coupled to transistors 330-333. Signals 314 and 316 are respectively the inverted counterpart of signals 313 and 315. In an example, signals 314 and 316 are normally provided by configuration memory cells M0-M1, but in the example being shown in FIG. 3A they are not used. Signal 313 may be coupled to a drain node of NMOS transistor 330 and a source node of PMOS transistor 332. Gate nodes of transistors 330 and 332 are coupled to signals IN1 and IN1_b respectively. Source node of transistor 330 is coupled to drain node of transistor 332 and to the output signal 335. In general, coupling transistors 330 and 332 in the manner described above forms a pass gate. NMOS transistor 331 and PMOS transistor 333 are coupled to one another forming another pass gate. Signal 315 may be coupled to a drain node of NMOS transistor 331 and a source node of PMOS transistor 333. Gate nodes of transistors 333 and 331 are coupled to signals IN1 and IN1_b respectively. Source node of transistor 331 is coupled to drain node of transistor 333 and to the output signal 335.

Table 1 illustrates the operation of the circuit 300. For instance, signal 335 (output of circuit 300) is selectively coupled to an output of configuration memory cells M0 or M1 based on signal IN1 and its inverted counterpart, signal IN1_b (provided by inverter 301).

TABLE 1

| IN1 | IN1_b | Signal 335 |
|---|---|---|
| 0 | 1 | 315 (output of M1) |
| 1 | 0 | 313 (output of M0) |

As shown in Table 1, if logic high "1" is coupled to signal IN1, a value coupled to signal 313 may be observed on signal 335. Coupling logic high "1" to signal IN1 may turn on transistors 330 and 332, therefore, allowing a value of signal 313 to be coupled to signal 335. Conversely, if logic low "0" is coupled to signal IN1, a value coupled to signal 315 may be observed on signal 335. Coupling logic high "0" to signal IN1 may turn on transistors 331 and 333, therefore, allowing a value of signal 315 to be coupled to signal 335.

Figure 3B:
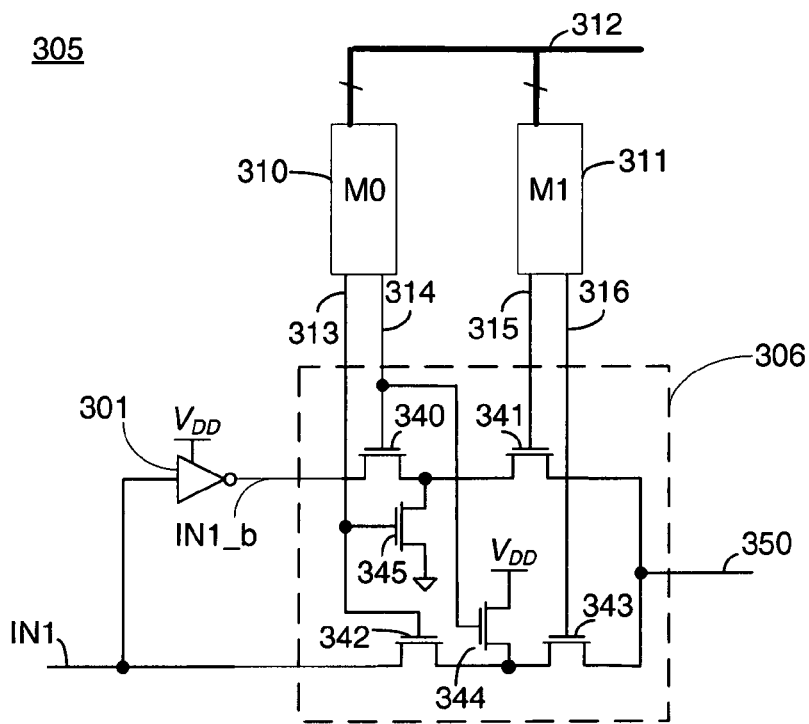
FIG. 3B illustrates a segment of a first stage select circuit of a LUT circuit according to an embodiment of the present invention.

FIG. 3B illustrates a select circuit according to an embodiment of the present invention. Circuit 305 operations may represent the operation of a 4:1 MUX circuit having an output (coupled to signal 350) selectively coupled to signals IN1, IN1_b, Vdd, and 0V based on values of the configuration memory cells M0-M1. The circuit shown in FIG. 3B may be used in a first stage of a LUT circuit according to an embodiment of the present invention. Signals 313-316 may be coupled to gate nodes of NMOS transistors 340-345. Signals IN1 and IN1_b may be coupled to drain nodes of NMOS transistors 342 and 340 respectively.

Circuit 306 may include six NMOS transistors 340-345 according to an embodiment of the present invention. The NMOS transistors 340-343 may have the similar properties, such as width (W), length (L), and gate oxide thickness. These parameters may contribute to enhanced performance, such as reduced propagation delay of circuit 305. Transistors 345 and 344 may be configured to as a pull-down and a pull-up respectively (when their respective gates are asserted). Transistor 340 has a drain node coupled to the signal IN1_b, a gate node coupled to signal 314, and a source node coupled to a drain node of transistor 341 and a drain node of transistor 345. Transistor 345 has a gate node coupled to signal 313 and source node coupled to a ground potential (0V). Transistor 341 has a gate node coupled to signal 315 and a source node coupled to signal 350 (output of circuit 305). Transistor 342 has a drain node coupled to the signal IN1, a gate node coupled to signal 313, and a source node coupled to a drain node of transistor 343 and a source node of transistor 344. Transistor 344 has a gate node coupled to signal 314 and drain node coupled to a first voltage supply (e.g., Vdd). Transistor 343 has a gate node coupled to signal 316 and a source node coupled to signal 350.

Table 2 set forth operation of circuit 305 according to an embodiment of the present invention. Signals IN1 and IN1_b are input signals to circuit 305, signals 313-316 are control signals to circuit 305, and signal 350 is the output of circuit 305. Signal IN1_b is the complement of signal IN1, signals 313-316 are outputs of configuration memory cells M0-M1 as described previously. In general, "0" represents logic low signal, and "1" represents logic high signal.

TABLE 2

| (M0) Signals 313/314 | (M1) Signals 315/316 | Output Signal 350 |
|---|---|---|
| 0/1 | 0/1 | 1 |
| 1/0 | 0/1 | IN1 |
| 0/1 | 1/0 | IN1_b |
| 1/0 | 1/0 | 0 |

Table 2 shows that signal 350 may be coupled to signals IN1, IN1_b, logic high "1", and logic low "0", based on signals 313-316. In general, a 2:1 MUX circuit may only provide two output values. The MUX circuit 305 response shown in Table 2 use similar signals as MUX circuit 300 but it behaves as a 4:1 MUX circuit. For instance, utilizing circuit 305 in a design may conserve resources, such as routing resources, area, and power. Also, circuit 306 has an advantage of using the same transistor type (e.g., NMOS transistors). For example, circuit 306 uses NMOS transistors 340-345 to propagate signals having logic high "1" and logic low "0" values without the need for PMOS transistors. The MUX circuit 300 uses both NMOS and PMOS transistors to propagating logic high "1" or logic "0". In general, coupling transistors in the way shown in FIG. 3A may form a pass gate. For example, coupling transistors 330 to 332 may form a pass gate; similarly, coupling transistors 331 to 333 may form another pass gate.

In general, NMOS transistors are used to propagate logic low "0", and PMOS transistors are used to propagate logic high "1". In an example, an NMOS had a drain node coupled to an input signal, a gate node coupled to a control signal and a source node is an output of the NMOS transistor. Turing on the NMOS transistor by coupling logic high "Vdd" to the control signal, and if the input signal is coupled to Vdd supply, as the output of the NMOS transistor approaches Vdd–Vth (Vth is the threshold voltage), the NMOS transistor begins to turn off. Therefore, the transmission of logic high (e.g., Vdd) degrades as it passes through NMOS transistor. But, if the gate voltage applied to the NMOS device is Vdd+Vth (e.g., Vgg), then a signal having a Vdd value coupled to the input of the NMOS transistor may be transmitted without degradation.

The design of circuit 305 uses the NMOS transistor behavior to its advantage. The design of the configuration memory cells of an FPGA device use higher voltage (e.g., Vgg) to provide signals having Vgg–0V voltage range. For example, signals 313-316 of configuration memory cells M0-M1 may have Vgg–0V voltage range. Circuit 305 may be coupled to input signals (e.g., IN1 and IN1_b) having Vdd–0V voltage range. In the example shown in FIG. 3B, the Vgg voltage has a value greater than a value of the Vdd voltage. For instance, signals 313-316 have Vgg–0V voltage range coupled to turn on and off NMOS transistors 340-343 of circuit 305. Therefore, propagating signals IN1 and IN1_b having the Vdd–0V voltage range without degradation.

Circuit 305 has clear advantages over circuit 300. For instance, improved performance, such as delay from an input (e.g. IN1, and/or IN1_b) to the output of circuit 305 (signal 345). Additional performance may be gained when using a thin gate oxide thickness in processing transistors 340-345. In general, transistors processed having thin gate oxide thickness may require smaller voltage applied to their gates in order to turn such transistors on and off. Therefore, the response time of thin gate oxide transistors is faster. In an example, the delay from the input signal IN1 or IN1_b to signal 345 may be in the range of 10 ps-50 ps, where ps is pico seconds. In another example, performance of circuit 305 may improved when using bigger NMOS transistors. In general, the bigger transistors (e.g., NMOS transistors) may increase their drive capability, therefore, reducing the propagation delay.

Figure 3C:
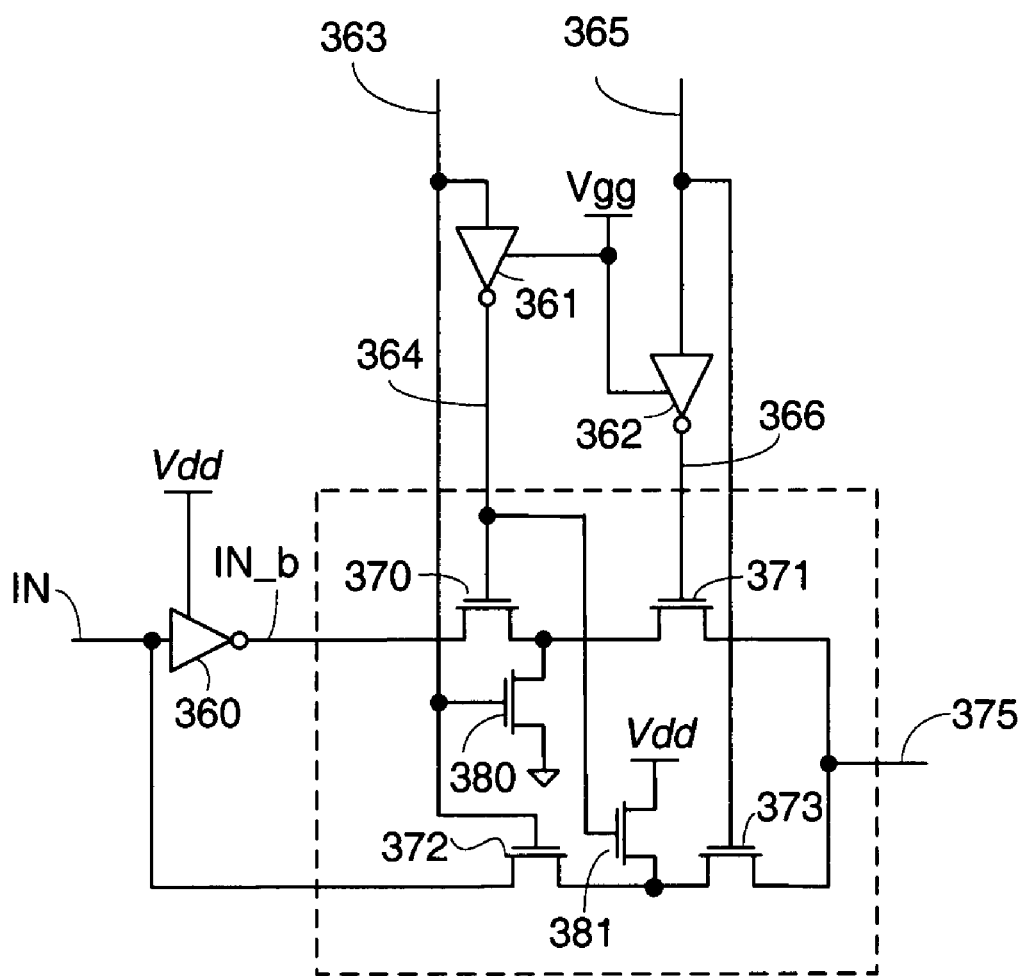
FIG. 3C illustrates a select circuit of an IC according to an embodiment of the present invention.

FIG. 3C illustrates a select circuit of an IC according to an embodiment of the present invention. Circuit 309 is similar to circuit 305 in terms of construction and functionality. Circuit 309 may be coupled to control signals rather than to memory cells or configuration memory cells. Therefore, MUX circuit 309 can be used in any IC where memory cells are not accessible. Circuit 309 may be coupled to receive signals 363, 365, and their respective inverted counterpart signals 364, and 366 (provided by inverters 361 and 362).

Signals IN and IN_b of FIG. 3C may have a voltage range extending from a first voltage to 0V. For instance, the first voltage may be a Vdd voltage. Inverter 360 may be powered by the Vdd voltage to provide the IN_b signal having the Vdd–0V voltage range. Signals 363-366 may have a voltage range extending from a second voltage to 0V. For instance, the second voltage may be Vgg voltage. Inverters 361-362 may be powered by the second voltage (e.g., Vgg) and provide signals 364, and 366. In an example, the second voltage is higher than the first voltage (e.g., Vgg>Vdd). Signals 363-366 are coupled to gates of NMOS transistors 370-373 and the may have Vgg–0V voltage range. Signals IN and IN_b are coupled to drain nodes of transistors 372, and 370 respectively, and they may have Vdd–0V voltage range. In the example shown in FIG. 3C, the Vgg voltage is greater than the Vdd voltage. Therefore, circuit 309 may have performance advantages over circuit 300 (e.g., short propagation delay). The performance advantageous are in part due to the use NMOS transistors to propagate signals having logic high "1" and logic low "0" without degradation, as it has been explained previously.

Figure 4:
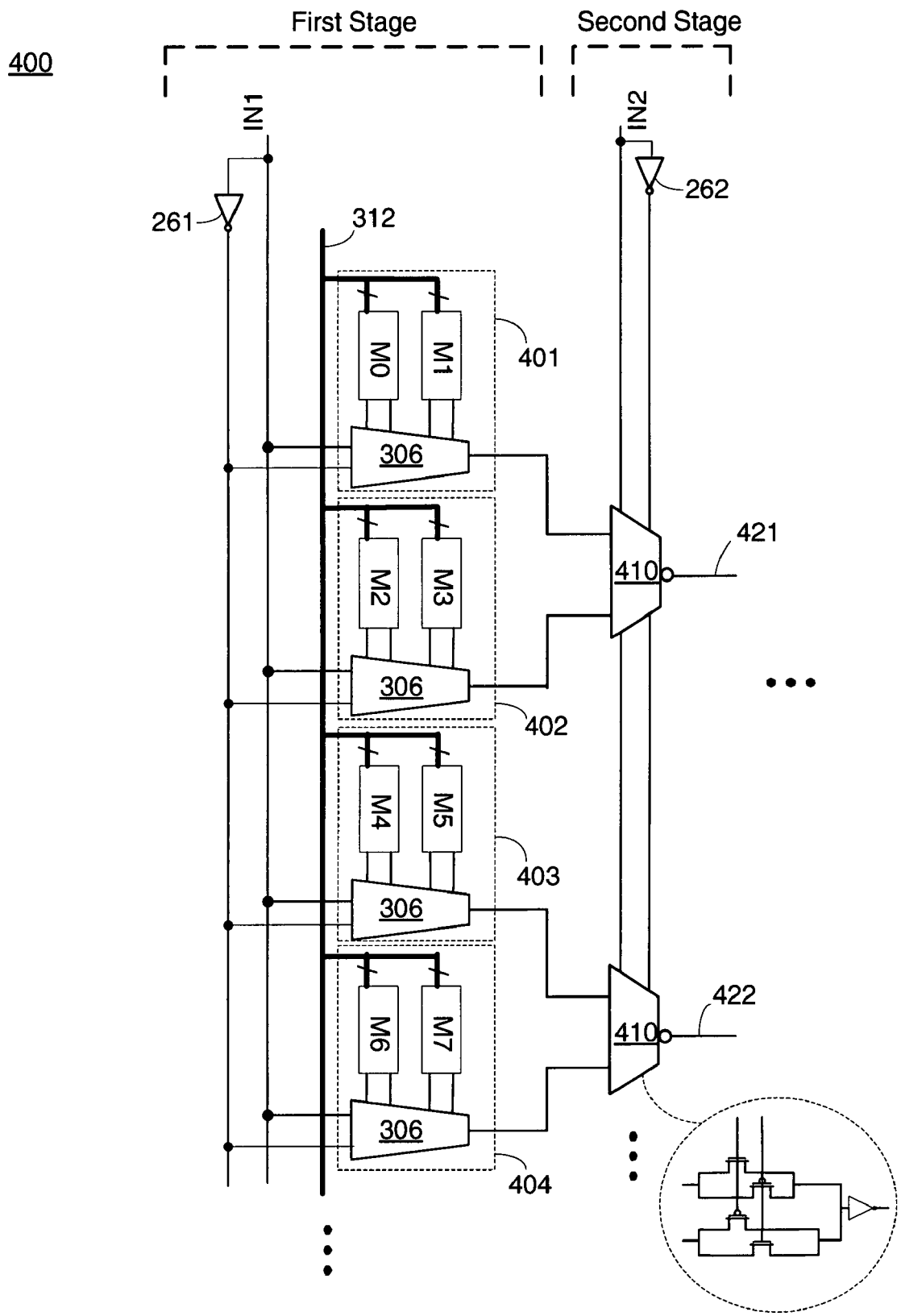
FIG. 4 illustrates a simplified first select stage coupled to a second select stage of a LUT circuit according to an embodiment of the present invention.

FIG. 4 illustrates a simplified block diagram of a first stage and a second stage of a LUT circuit coupled together according to an embodiment of the present invention. As discussed previously, a LUT circuit may include multiple stages. FIG. 4 shows a part of a LUT circuit where the first stage includes numerous instantiations of MUX circuits 305 (e.g., MUX circuits 401-404), and a second stage includes 2:1 MUX circuits. MUX circuits 401-404 may be coupled to signals IN1 and its inverted counterpart (provided by inverter 261), and to configuration memory cells M0-M7. Output 421 of the second stage may be selectively coupled to an output of MUX circuits 401 or 402 based on signal IN2, and its inverted counterpart (provided by inverter 262). Similarly, output 422 of the second stage may be selectively coupled to an output of MUX circuits 403 or 404 based on signal IN2, and its inverted counterpart.

The configuration memory cells M0-M7 may be configured or programmed during the configuration process. The IN1 signal, input to select circuits 401-404, may be dynamically controlled as a part of the circuit design. For instance, controlling MUX circuits 401-404 with signals having static values, such as outputs of memory cells M0-M7, may yield shorter propagation delays. Therefore, MUX circuits 401-404 may have higher performance. Static signals coupled to gate nodes of transistors may operate such transistors in a steady state (e.g. either on or off state). Conversely, dynamic signals, such as a clock signal, may affect delays of the transistors that are coupled to such signals. Signals may not propagate through a transistor until the transistor reaches its on state. In the case of the dynamic signals, the rise time or the fall time may determine the propagation delay of the transistors.

Figure 5:
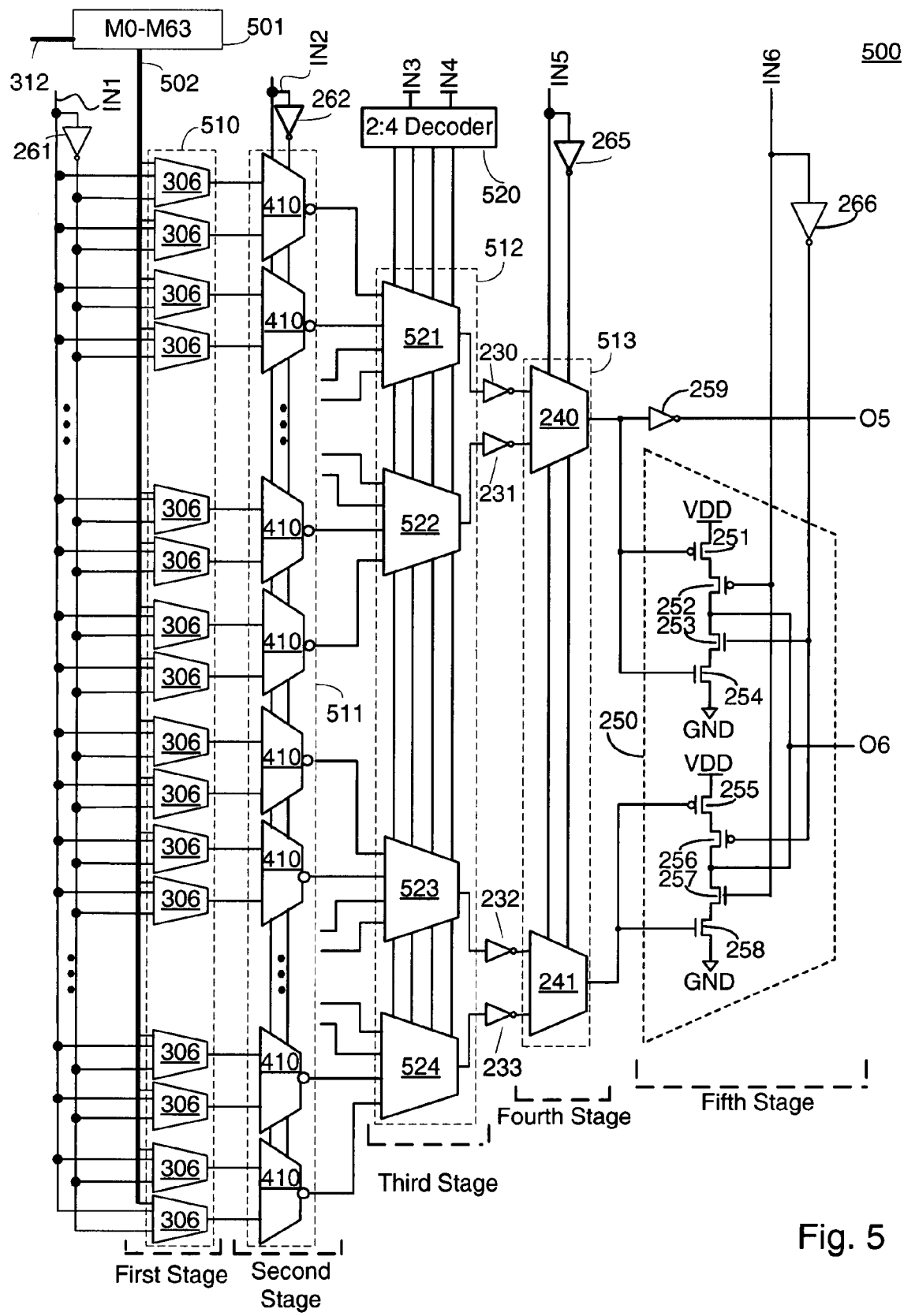
FIG. 5 illustrates a block diagram of a LUT circuit according to an embodiment of the present invention.

FIG. 5 illustrates a block diagram of a LUT circuit according to an embodiment of the present invention. In an example, circuit 500 represents the operation of a 64:1 multi-stage MUX circuit. The circuit of FIG. 5 may include five stages. Other MUX circuit configurations and/or number of stages are possible and well known to persons skilled in the art. For example, a four stage LUT circuit may be implemented by omitting the last MUX stage of FIG. 5. Persons skilled in the art may elect optimum number of MUX stages that better suit their design. Circuit 500 includes a first stage and a second stage similar to the circuit described in FIG. 4. The first stage shown in FIG. 5 may include numerous instantiations of circuit 306 coupled to receive outputs of memory cells M0-M63 (e.g., signals 502). The first stage 510 consists of thirty two MUX circuits, where each MUX circuit includes circuit 306 of FIG. 3B. Circuit 500 may be controlled by signals 502, and signals IN1-IN6, where signals 502 may be static and signals IN1-IN6 may be dynamic. In general, circuit 500 may have similar functionality as the MUX circuit described in FIG. 2, but circuit 500 has performance advantageous, such as shorter propagation delays.

The second stage (circuit 511) may include sixteen 2:1 MUX circuits controlled by signal IN2 and its complement (provided by inverter 262). The second stage may be coupled to circuit 512 including four 4:1 MUX circuits 521-524. In an example, circuit 512 may be viewed as two 2:1 MUX stages combined to perform as one. Circuit 512 may be coupled to a decoder circuit 520 providing control signals. For instance, decoder circuit 520 may be coupled to receive signals IN3-IN4 and provide control signals coupled to MUX circuits 521-524. MUX circuits 521-524 provide output signals respectively coupled to inputs of inverter circuits 230-233. The inverter circuits 230-233 provide signals coupled to a fourth stage 513 which may include two 2:1 MUX circuits 240-241. MUX circuits 240-241 selectively couple signals to their respective outputs based on signal IN5 and its inverted counterpart (provided by inverter 265). MUX circuits 240-241 provide signals coupled to a fifth stage 250. MUX 250 provides an output coupled to signal O6 based on signal IN6 and its inverted counterpart (provided by inverter 266).

Circuit 500 may have improved performance over circuit 200. Circuit 500 includes the first stage (circuit 510) with reduced propagation delay, and circuit 512 which may also have reduced propagation delay. Circuit 512 and the 2:4 decoder circuit will be described below. In general, designing a high performance logic function utilizing a multi-stage MUX circuit may require using MUX stage(s) closer to an output of the multi-stage MUX circuit. MUX stage(s) closer to the output of the multi-stage MUX has the least amount of propagation delay (e.g., minimal propagation delay from the input signal to the output of the multi-stage MUX circuit). In an example, a high performance or high speed logic function may utilize stages 513 and 250. Conversely, low performance or slow speed logic function may use any combination of stages 510-513, and 250.

Circuit 500 uses a variety of MUX circuits (e.g., 2:1 and 4:1 MUX circuits), a decoder circuit (e.g., 2:4 decoder circuit 520), and tri-state buffers (circuit 250). Other types of circuits may be used to implement the same function as circuit 500. In an example, a 3:8 decoder circuit may be coupled to an 8:1 MUX circuit(s). For instance, the third stage 512 and the fourth stage 513 may be combined to form the 8:1 MUX stage. Persons skilled in the art may make deign determination based on performance and design requirements.

In general, the higher the number of stages used in a LUT the greater number of logic functions that can be implemented. One area targeted for improvement in LUT circuits having multiple stages is propagation delay. For instance, when the number of stages increases so does the delay through the LUT circuit. So, it is desirable to have a multi-stage versatile LUT circuit with minimal delay. Circuit 500 addresses performance minded designs, where circuit 500 may include the first stage 510 and the fourth stage 512 delivers much desired performance and design flexibility.

Figure 6:
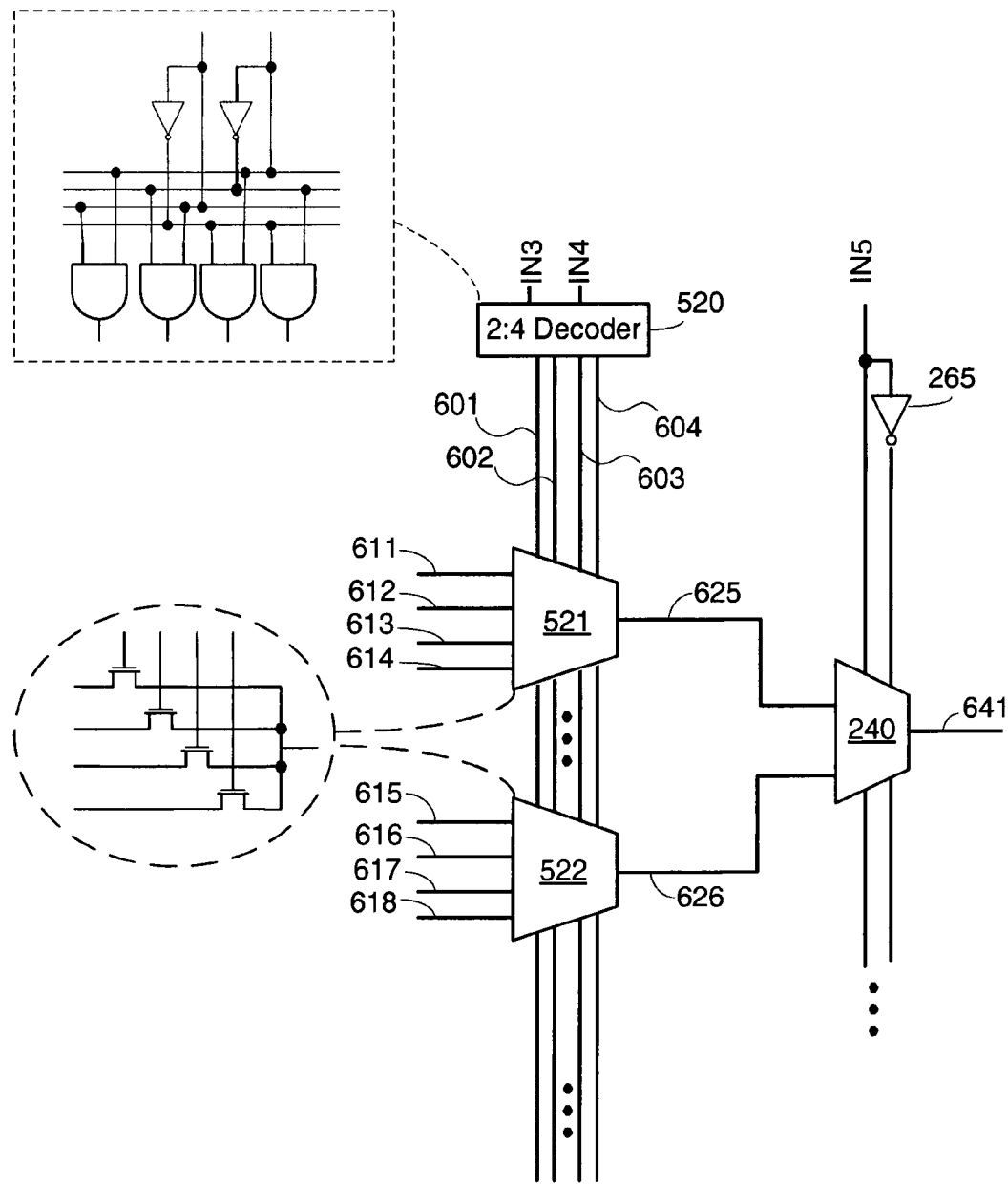
FIG. 6 illustrates a block diagram of a select circuit coupled to a decoder circuit according to an embodiment of the present invention.

FIG. 6 is a segment of stages 512 and 513 of circuit 500 and it illustrates a functionality of an 8:1 MUX circuit according to an embodiment of the present invention. Circuit 600 may include 4:1 MUX circuits 521-522, and a 2:1 MUX circuit 240. Circuit 600 is coupled to receive input signals 611-618, control signals IN3-IN5, and provide output signal 641. Signal 641 is selectively coupled to one of signals 611-618 based on control signals IN3-IN5. Circuit 600 may also include the 2:4 decoder circuit 520 coupled to receive control signals IN3-IN4 and provide signals 601-604 coupled to the 4:1 MUX circuits 521-522.

Table 3 (described below) may represent the operation of the 2:4 decoder circuit 520. For instance, toggling control signals IN3-IN4 may assert one of the signals 601-604. For example, signal 625 (output of MUX circuit 521) is selectively coupled to signals 611-614 based on signals 601-604. Similarly, signal 626 (output of MUX circuit 522) is selectively coupled to signals 615-618 based on signals 601-604. For instance, if signal 602 is asserted, then a value of signal 612 may be coupled to signal 625, and a value of signal 616 may be coupled to signal 626, etc. Signal 641 is selectively coupled to signal 625 or signal 626 based on the IN5 control signal and its inverted counterpart (provided by inverter 265).

Using a decoder circuit, such as the 2:4 decoder circuit 520 of FIG. 6, may reduce propagation delays across MUX circuits. The reduction in propagation delay is due in part to the reduced number of transmission transistors that a signal needs to propagate through. For instance, the 4:1 MUX circuits 220-223 of FIG. 2 have two stages of transmission transistors, while the 4:1 MUX circuits 521-522 of FIG. 6 have only one stage of transmission transistor. In another example, using a decoder circuit, such as circuit 520, may yield a more predictable delay than using individual control signals. For instance, individual control signals may be skewed or delayed from one another due to many factors, such as routing. Conversely, decoder circuit 520 may enable one signal provided to a MUX circuit(s), where skew between control signals (e.g., signals IN3-IN4) are absorbed in the logic forming the decoder circuit. Using the circuit described above may be a very valuable for enhanced design performance using LUT circuits of an FPGA.

Circuit 520 may activate/enable one of signals 601-604 based on signals IN3-IN4. Table 3 illustrates an example of circuit 520 response to input signals IN3-IN4. In general, "1" is logic high, and "0" is logic low.

TABLE 3

| IN3 | IN4 | 601 | 602 | 603 | 603 |
|-----|-----|-----|-----|-----|-----|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

The decoder circuit 520 may be implemented using combinational logic (as illustrated in FIG. 6). Other implementations of decoder circuit and alternative truth tables (Table 3) are possible and they are well known to persons skilled in the art.

Those having skill in the relevant arts will now perceive various modifications and additions that can be made as a result of the disclosure herein. For example, the LUT circuits illustrated herein each include two multiplexer stages between each pair of buffers and/or tri-state buffer circuits. However, one or more than two stages can be supplied before and/or after the butters and tri-state buffer circuits. Further, the above text describes the circuits of the invention in the context of field programmable gate arrays (FPGAs). However, the LUT circuits of the invention can also be included in other types of programmable logic devices (PLDs).

Further, pullups, pulldowns, transistors, P-channel transistors, N-channel transistors, pass gates, CMOS pass gates, multiplexers, buffers, tri-state buffers, tri-state buffer circuits, and other components other than those described herein can be used to implement the invention. For example, size of NMOS transistors 720 and 721 of circuit 700 may be different from NMOS transistors 710-713. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An integrated circuit (IC), comprising:
   a plurality of memory cells; and
   a multiplexer circuit comprising:
      a first input terminal and a second input terminal respectively coupled to an output of a first memory cell and an output of a second memory cell of the plurality of memory cells; and
      select terminals coupled to a control signal and a complement of the control signal,
   wherein an output of the multiplexer circuit is selectively coupled to one of four signals based on the output of the first memory cell and the output of the second memory cell, and
   wherein two of the four signals are the control signal and the complement of the control signal.

2. The IC of claim 1, wherein the control signal and the complement of the control signal have a first voltage range that extends from a first voltage to 0V,
   wherein the output of the first memory cell and the output of the second memory cell have a second voltage range that extends from a second voltage to 0V, and
   wherein the second voltage is greater than the first voltage.

3. The IC of claim 2, wherein the multiplexer circuit comprises:
   a first transistor having a drain node coupled to the control signal, and a gate node coupled to the output of the first memory cell;
   a second transistor having a drain node coupled to a source node of the first transistor, a gate node coupled to a complement of the output of the first memory cell, and a source node coupled to the first voltage;
   a third transistor having a drain node coupled to the source node of the first transistor, a gate node coupled to the output of the second memory cell, and a source node coupled to the output of the multiplexer circuit;
   a fourth transistor having a drain node coupled to the complement of the control signal, a gate node coupled to the complement of the output of the first memory cell;
   a fifth transistor having a source node coupled to a source node of the fourth transistor, a gate node coupled to the output of the first memory cell, and a drain node coupled to 0V; and
   a sixth transistor having a drain node coupled to the source node of the fourth transistor, a gate node coupled to a complement of the output of the second memory cell, and a source node coupled to the output of the multiplexer circuit.

4. The IC of claim 3, wherein the first transistor, the second transistor, the third transistor, the fourth transistor, the fifth transistor, and the sixth transistor are NMOS transistors.

5. The IC of claim 3, wherein at least one of the first transistor, the second transistor, the third transistor, the fourth transistor, the fifth transistor, and the sixth transistor is processed to have a thin gate oxide thickness.

6. A lookup table (LUT) circuit, comprising:
   a plurality of memory cells; and
   a first multiplexer stage including a first plurality of 2:1 multiplexer circuits having inputs coupled to outputs of the plurality of memory cells, a first control signal, and a complement of the first control signal,
   wherein each output of the first multiplexer stage is selectively coupled to one of four signals based on the outputs of the plurality of memory cells, and
   wherein two of the four signals are the first control signal and the complement of the first control signal.

7. The LUT circuit recited in claim 6, wherein the plurality of memory cells is a plurality of configuration memory cells.

8. The LUT circuit recited in claim 6, further comprising:
   a second multiplexer stage comprising:
      a decoder circuit having inputs coupled to a second control signal; and
      at least one 4:1 multiplexer circuit having inputs coupled to outputs of the first multiplexer stage, and outputs of the decoder circuit,
      wherein an output of the at least one 4:1 multiplexer circuit is selectively coupled to an output of the outputs of the first multiplexer stage based on the outputs of the decoder circuit.

9. The LUT circuit recited in claim 6, further comprising:
   a second multiplexer stage comprising a second plurality of 2:1 multiplexer circuits having inputs coupled to outputs of the first multiplexer stage, a second control signal, and a complement of the second control signal,
   wherein each output of the second plurality of 2:1 multiplexer circuits is selectively coupled to an output of the outputs of the first stage multiplexer circuits based on the second control signal, and
   wherein at least one of the second plurality of 2:1 multiplexer circuits comprises a tri-state buffer.

10. The LUT circuit recited in claim 9, further comprising:
    a third multiplexer stage comprising:
       a decoder circuit having inputs coupled to a third control signal; and
       at least one 4:1 multiplexer circuit having inputs coupled to outputs of the second multiplexer stage, and outputs of the decoder circuit,
       wherein an output of the at least one 4:1 multiplexer circuit is selectively coupled to an output of the outputs of the second multiplexer stage based on the outputs of the decoder circuit.

11. The LUT recited in claim 6, wherein each 2:1 multiplexer circuit of the first plurality of 2:1 multiplexer circuits comprising:
    a first transistor having a drain node coupled to the first control signal, and a gate node coupled to an output of a first memory cell of the plurality of memory cells;
    a second transistor having a drain node coupled to a source node of the first transistor, a gate node coupled to a complement of the output of the first memory cell of the plurality of memory cells, and a source node coupled to a first voltage;
    a third transistor having a drain node coupled to the source node of the first transistor, a gate node coupled to an output of a second memory cell of the plurality of memory cells, and a source node coupled to an output of the 2:1 multiplexer circuit;
    a fourth transistor having a drain node coupled to the complement of the first control signal, and a gate node coupled to the complement of the output of a first memory cell of the plurality of memory cells;
    a fifth transistor having a source node coupled to a source node of the fourth transistor, a gate node coupled to the output of the first memory cell of the plurality of memory cells, and a drain node coupled to 0V; and
    a sixth transistor having a drain node coupled to the source node of the fourth transistor, a gate node coupled to a complement of the output of the second memory cell of the plurality of memory cells, and a source node coupled to the output of the 2:1 multiplexer circuit.

12. The LUT circuit recited in claim 11, wherein the first transistor, the second transistor, the third transistor, the fourth transistor, the fifth transistor, and the sixth transistor are NMOS transistors.

13. The LUT circuit recited in claim 11, wherein at least one of the first transistor, the second transistor, the third transistor, the fourth transistor, the fifth transistor, and the sixth transistor is processed to have a thin gate oxide thickness.

14. The LUT circuit recited in claim 11, wherein the first control signal and the complement of the first control signal have voltage range that extends from the first voltage to 0V,
    wherein the outputs of the plurality of memory cells have voltage range that extends from a second voltage to 0V, and
    wherein the second voltage is greater than the first voltage.

15. A select circuit comprising:
    a first transistor having a drain node coupled to a control signal, and a gate node coupled to a first signal;

a second transistor having a drain node coupled to a source node of the first transistor, a gate node coupled to a complement of the first signal, and a source node coupled to a first voltage;

a third transistor having a drain node coupled to the source node of the first transistor, a gate node coupled to a second signal, and a source node coupled to an output of the select circuit;

a fourth transistor having a drain node coupled to a complement of the control signal, and a gate node coupled to the complement of the first signal;

a fifth transistor having a source node coupled to a source node of the fourth transistor, a gate node coupled to the first signal, and a drain node coupled to 0V; and a sixth transistor having a drain node coupled to the source node of the fourth transistor, a gate node coupled to a complement of the second signal, and a source node coupled to the output of the select circuit.

16. The IC of claim 15, wherein the control signal and the complement of the control signal have a first voltage range that extends from the first voltage to 0V, wherein the first signal, the complement of the first signal, the second signal, and the complement of the second signal have a second voltage range that extends from a second voltage to 0V, and wherein the second voltage is greater than the first voltage.

17. The select circuit recited in claim 15, wherein the first transistor, the second transistor, the third transistor, the fourth transistor, the fifth transistor, and the sixth transistor are NMOS transistors.

18. The select circuit recited in claim 15, wherein at least one of the first transistor, the second transistor, the third transistor, the fourth transistor, the fifth transistor, and the sixth transistor is processed to have a thin gate oxide thickness.

* * * * *